United States Patent
Taneda et al.

(10) Patent No.: US 11,729,914 B2
(45) Date of Patent: Aug. 15, 2023

(54) WIRING BOARD

(71) Applicant: SHINKO ELECTRIC INDUSTRIES CO., LTD., Nagano (JP)

(72) Inventors: Hiroshi Taneda, Nagano (JP); Noriyoshi Shimizu, Nagano (JP); Rie Mizutani, Nagano (JP); Masaya Takizawa, Nagano (JP); Yoshiki Akiyama, Nagano (JP)

(73) Assignee: SHINKO ELECTRIC INDUSTRIES CO.. LTD., Nagano (JP)

( * ) Notice: Subject to any disclaimer, the term of this patent is extended or adjusted under 35 U.S.C. 154(b) by 0 days.

(21) Appl. No.: 17/660,701

(22) Filed: Apr. 26, 2022

(65) Prior Publication Data

US 2022/0361340 A1    Nov. 10, 2022

(30) Foreign Application Priority Data

May 10, 2021    (JP) .................................. 2021-079993

(51) Int. Cl.
*H05K 1/18*    (2006.01)
*H05K 1/11*    (2006.01)
*H01G 4/33*    (2006.01)

(52) U.S. Cl.
CPC ............. *H05K 1/186* (2013.01); *H05K 1/113* (2013.01); *H01G 4/33* (2013.01); *H05K 2201/10015* (2013.01)

(58) Field of Classification Search
CPC .......... H05K 1/18; H05K 1/186; H05K 1/113; H05K 2201/10015; H01G 4/33
USPC ........................................................ 174/260
See application file for complete search history.

(56) References Cited

U.S. PATENT DOCUMENTS

2019/0306981 A1    10/2019  Furuyama et al.

FOREIGN PATENT DOCUMENTS

JP    2019-179865    10/2019

*Primary Examiner* — Tremesha S Willis
(74) *Attorney, Agent, or Firm* — IPUSA, PLLC

(57) ABSTRACT

A wiring board includes an insulating layer, a thin film capacitor laminated on the insulating layer, an interconnect layer electrically connected to the thin film capacitor, and an encapsulating resin layer laminated on the thin film capacitor. The interconnect layer includes a pad protruding from the thin film capacitor. The encapsulating resin layer is a mold resin having a non-photosensitive thermosetting resin as a main component thereof. The encapsulating resin layer exposes a top surface of the pad, and covers at least a portion of a side surface of the pad.

12 Claims, 10 Drawing Sheets

WIRING BOARD

CROSS-REFERENCE TO RELATED APPLICATIONS

This application is based upon and claims priority to Japanese Patent Application No. 2021-079993, filed on May 10, 2021, the entire contents of which are incorporated herein by reference.

FIELD

The present disclosure relates to wiring boards, and methods for manufacturing wiring boards.

BACKGROUND

Conventionally, as wiring boards on which electronic components, such as semiconductor chips or the like are mounted, there is a known wiring board having multiple interconnect layers and multiple insulating layers that are alternately laminated by a build-up method, in order to increase the density of interconnect patterns. This type of wiring board having a configuration in which a thin film capacitor is embedded inside to improve transmission characteristics has been studied. This type of wiring board is proposed in Japanese Laid-Open Patent Publication No. 2019-179865, for example.

In order to further improve the transmission characteristics of the wiring board, the thin film capacitor needs to be provided at a top surface closer to a semiconductor chip. However, when mounting the semiconductor chip on the wiring board having the thin film capacitor provided at the top surface, the thin film capacitor may be damaged due to thermal stress or pressure during mounting.

SUMMARY

Accordingly, it is one object of the present disclosure to provide a wiring board capable of reducing damage to a thin film capacitor.

According to one aspect of embodiments of the present disclosure, a wiring board includes an insulating layer; a thin film capacitor laminated on the insulating layer; an interconnect layer electrically connected to the thin film capacitor; and an encapsulating resin layer laminated on the thin film capacitor, wherein the interconnect layer includes a pad protruding from the thin film capacitor, the encapsulating resin layer is a mold resin having a non-photosensitive thermosetting resin as a main component thereof, and the encapsulating resin layer exposes a top surface of the pad, and covers at least a portion of a side surface of the pad.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
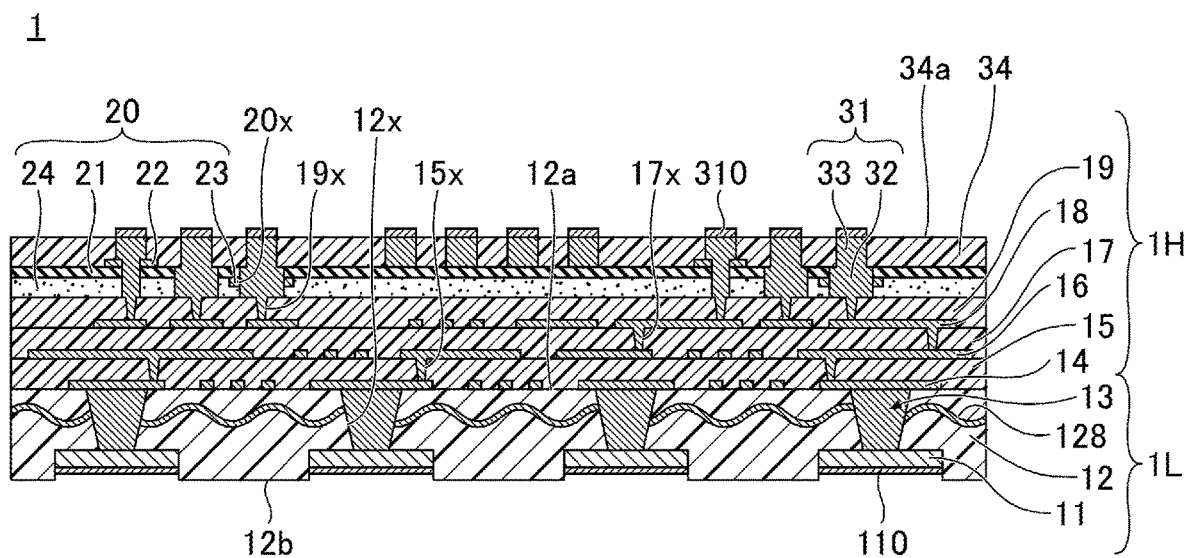
FIG. 1A and FIG. 1B are cross sectional views illustrating an example of a wiring board according to a first embodiment.

Preferred embodiments of the present invention will be described with reference to the accompanying drawings. In the drawings, those constituent elements that have substantially the same functional configurations are designated by the same reference numerals, and a repeated description of the same parts may be omitted.

First Embodiment

[Configuration of Wiring Board]

Figure 1B:
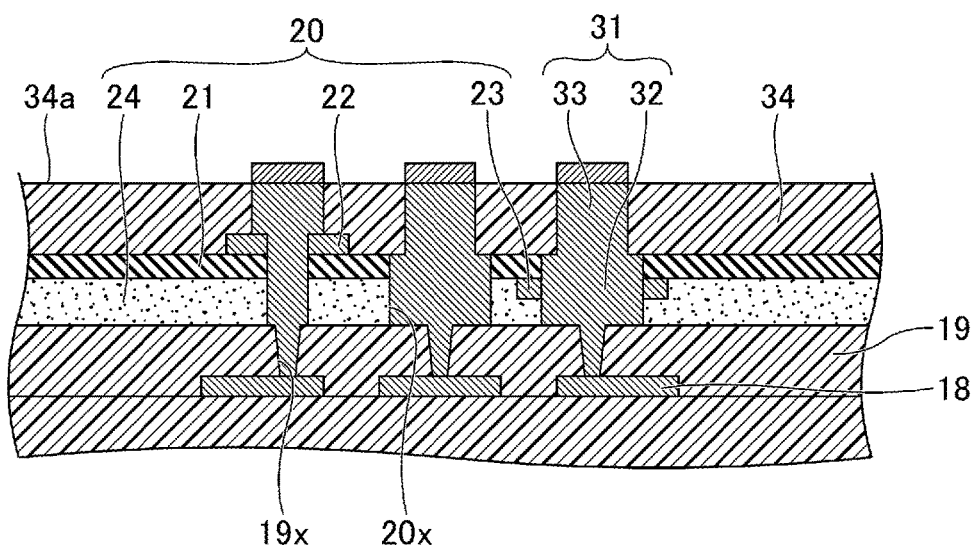

First, a configuration of a wiring board according to a first embodiment will be described. FIG. 1A and FIG. 1B are cross sectional views illustrating an example of the wiring board according to the first embodiment. FIG. 1B is an enlarged view of a thin film capacitor 20 and a vicinity thereof in FIG. 1A.

As illustrated in FIG. 1A and FIG. 1B, a wiring board 1 according to the first embodiment includes a first interconnect structure 1L, a second interconnect structure 1H laminated on the first interconnect structure 1L, and an encapsulating resin layer 34 laminated on the second interconnect structure 1H. A planar shape of the wiring board 1 may be a square shape or a rectangular shape, for example. However, the planar shape of the wiring board 1 is not limited to such shapes, and the wiring board 1 may have an arbitrary planar shape.

The first interconnect structure 1L includes a low-density interconnect layer formed with an interconnect layer having a lower interconnect density than the second interconnect structure 1H. The first interconnect structure 1L includes an interconnect layer 11, an insulating layer 12, and an interconnect layer 13. In contrast, the second interconnect structure 1H includes a high-density interconnect layer formed with an interconnect layer having a higher interconnect density than the first interconnect structure 1L. The second interconnect structure 1H includes an interconnect layer 14, an insulating layer 15, an interconnect layer 16, an insulating layer 17, an interconnect layer 18, an insulating layer 19, the thin film capacitor 20, and an interconnect layer 31.

In the present embodiment, for the sake of convenience, a top-side or one side of the wiring board 1 refers to the side of the wiring board 1 provided with an encapsulating resin layer 34, and a bottom-side or the other side of the wiring board 1 refers to the side of the wiring board 1 provided with the insulating layer 12. In addition, one surface or a top surface of each part of the wiring board 1 refers to the surface on the side provided with the encapsulating resin layer 34, and the other surface of a bottom surface of each part of the wiring board 1 refers to the surface on the side provided with the insulating layer 12. However, the wiring board 1 may be used in an upside-down state, or may be disposed at an arbitrary angle. Further, a plan view of an object refers to a view of the object viewed in a normal direction to a top surface 34a of the encapsulating resin layer 34, and a planar shape refers to a shape of the object in the plan view, that is, the shape of the object viewed in the normal direction to the top surface 34a of the encapsulating resin layer 34.

The interconnect layer 11 is a lowermost interconnect layer that is exposed at a bottom surface of the insulating layer 12, and a top surface and a side surface of the interconnect layer 11 are covered by the insulating layer 12. A bottom surface of the interconnect layer 11 is exposed from the a bottom surface 12b of the insulating layer 12 at a position recessed toward the interconnect layer 13, for example. However, the bottom surface of the interconnect layer 11 may coincide with the bottom surface 12b of the insulating layer 12, as required. Alternatively, a portion of the side surface and the bottom surface of the interconnect layer 11 may protrude downward from the bottom surface 12b of the insulating layer 12.

The interconnect layer 11 is a circular pad having a circular planar shape with a diameter of approximately 150 μm, for example, but may include an interconnect pattern. A spacing between adjacent interconnect layers 11 may be approximately 200 μm, for example. Examples of a material used for the interconnect layer 11 include copper (Cu) or the like, for example. Ae thickness of the interconnect layer 11 may be in a range of approximately 10 μm to approximately 20 μm, for example. The interconnect layer 11 can be used as an external connection terminal (or pad) for making electrical connection with other wiring boards.

A surface treatment layer 110 may be formed on the bottom surface of the interconnect layer 11. Examples of the surface treatment layer 110 include an Au layer, a Ni/Au layer (a metal layer in which a Ni layer and a Au layer are laminated in this order), a Ni/Pd/Au layer (a metal layer in which a Ni layer, a Pd layer, and a Au layer are laminated in this order), or the like. In addition, the bottom surface of the interconnect layer 11 may be subjected to an anti-oxidation treatment, such as an Organic Solderability Preservative (OSP) treatment or the like.

The insulating layer 12 covers the top surface and the side surfaces of the interconnect layer 11. The insulating layer 12 includes a non-photosensitive thermosetting resin as a main component thereof, and a reinforcing member 128. The insulating layer 12 may be configured to include the reinforcing member 128 impregnated with the non-photosensitive thermosetting resin. Herein, "includes a non-photosensitive thermosetting resin as a main component thereof" means that other components, such as a filler or the like, may be included in addition to the thermosetting resin.

Examples of the non-photosensitive thermosetting resin used for the insulating layer 12 include epoxy resins, imide resins, phenolic resins, cyanate-based resins, or the like, for example. Examples of the reinforcing member 128 include woven and non-woven fabrics such as glass fiber, carbon fiber, aramid fiber, or the like, for example. Examples of the filler included in the insulating layer 12 include silica ($SiO_2$), kaolin ($Al_2Si_2O_5$ ($OH_4$)), talc ($Mg_3Si_4O_{10}$ ($OH_2$)), alumina ($Al_2O_3$), or the like, for example. In addition, the filler may include a mixture of such materials.

A thickness of the insulating layer 12 may be in a range of approximately 60 μm to approximately 70 μm, for example. A thermal expansion coefficient (or coefficient of thermal expansion) of the insulating layer 12 may be in a range greater than or equal to 5 ppm/° C. and less than or equal to 10 ppm/° C. The thermal expansion coefficient of the insulating layer 12 may be adjusted to a predetermined value by a filler content, a composition of the insulating resin, or the like, for example. The thermal expansion coefficient of the insulating layer 12 is lower than the thermal expansion coefficient of each of the insulating layers 15, 17, and 19.

The interconnect layer 13 is a via interconnect embedded in the insulating layer 12. More particularly, the interconnect layer 13 is a via interconnect filled inside a via hole 12x that penetrates the insulating layer 12 and exposes the top surface of the interconnect layer 11, and this via interconnect is electrically connected to the interconnect layer 11. The via hole 12x may be a recess having an inverted truncated cone shape. A diameter of a first opening of the via hole 12x which opens at the insulating layer 15, may be greater than a diameter of a second opening of the via hole 12x which opens at the top surface of the interconnect layer 11. A bottom surface of the second opening of the via hole 12x is formed by the top surface of the interconnect layer 11. The first opening of the via hole 12x may have a diameter in a range of approximately 60 μm to approximately 70 μm, for example.

A top surface of the interconnect layer 13, which is the via interconnect, is exposed from the top surface 12a of the insulating layer 12. The top surface of the interconnect layer 13 may coincide with the top surface 12a of the insulating layer 12, for example. The top surface of the interconnect layer 13 is directly bonded to a bottom surface of the interconnect layer 14. In addition, a bottom surface of the interconnect layer 13 is directly bonded to the interconnect layer 11 within the insulating layer 12. A material used for the interconnect layer 13 may be similar to the material used for the interconnect layer 11, for example.

In the present embodiment, the interconnect layer 13 is formed solely of the via interconnect formed in the via hole 12x of the insulating layer 12. In other words, the interconnect layer 13 includes no interconnect pattern formed integrally on the top surface 12a of the insulating layer 12. The interconnect layer 13 and interconnect layer 14 are electrically connected, but are not formed integrally. More particularly, in a method for manufacturing the wiring board which will be described later, when the interconnect layer 14 is formed by a semi-additive method, a seed layer is interposed between the top surface of the interconnect layer 13 and a bottom surface of the interconnect layer 14. The reason for employing such a configuration is to form a high-density interconnect pattern, having a line-and-space (L/S) of approximately 3 μm/3 μm, as the interconnect layer 14 described below. A description of the interconnect layer 14 in more detail will be given later in conjunction with the method for manufacturing the wiring board 1.

The interconnect layer 14 is formed on the top surface 12a of the insulating layer 12. The interconnect layer 14 is formed directly on the top surface 12a of the insulating layer 12, and includes an interconnect, such as interconnect patterns and pads, electrically connected to the interconnect layer 11 through the interconnect layer 13. In other words, a portion of the bottom surface of the interconnect layer 14 is in contact with the top surface of the interconnect layer 13, and the interconnect layer 14 and the interconnect layer 13 electrically connected to each other. A material, such as copper (Cu) or the like, for example, may be used for the interconnect layer 14. The interconnect layer 14 may be a laminated film including a plurality of laminated conductor layers.

The interconnect layer 14 has a higher interconnect density, that is, a narrower line-and-space (L/S), than the interconnect layer 11. Further, the interconnect layer 14 is thinner than the interconnect layer 11. In this specification, an interconnect layer having a line-and-space (L/S) less than or equal to 8 μm/8 μm is regarded as an interconnect layer having a high interconnect density. The line-and-space (L/S) of the interconnect layer 14 may be in a range of approximately 1 μm/1 μm to approximately 3 μm/3 μm, for example. The thickness of the interconnect layer 14 may be in a range of approximately 1 μm to approximately 3 μm, for example.

The line of the line-and-space (L/S) represents a trace width (or width of interconnect), and the space of the line-and-space (L/S) represents a spacing of adjacent interconnects (or space between adjacent interconnects). For example, when the line-and-space (L/S) is represented as 2 μm/2 μm, the trace width is 2 μm, and the spacing of the adjacent interconnects is 2 μm.

The insulating layer 15 is an insulating layer that includes a photosensitive resin as a main component thereof. The insulating layer that "includes a photosensitive resin as a main component" means that the insulating layer may include components other than the photosensitive resin, such as a filler or the like. For example, the insulating layer 15 may include a filler, such as silica ($SiO_2$) or the like.

The insulating layer 15 is formed on the top surface 12a of the insulating layer 12, so as to cover the interconnect layer 14. Examples of the photosensitive resin used for the insulating layer 15 include an insulating resin, such as phenolic resins, polyimide resins, or the like, for example. A thickness of the insulating layer 15 may be in a range of approximately 5 μm to approximately 10 μm, for example. A thermal expansion coefficient of the insulating layer 15 may be in a range greater than or equal to 40 ppm/° C. and less than or equal to 60 ppm/° C., for example. The thermal expansion coefficient of the insulating layer 15 may be adjusted to a predetermined value by a filler content, a composition of the insulating resin, or the like, for example.

However, in the insulating layer 15 having the photosensitive resin as the main component thereof, there is a limit (that is, upper limit) to the amount of the filler that can be included (that is, the filler content), because an exposure becomes impossible when the filler content is high. Accordingly, the thermal expansion coefficient of the insulating layer 15, having the photosensitive resin as the main component thereof, has a tendency to become higher than the thermal expansion coefficient of the insulating layer 12, having the non-photosensitive thermosetting resin as the main component thereof, and higher than the thermal expansion coefficient of the encapsulating resin layer 34.

The interconnect layer 16 is formed on one side of the insulating layer 15, and is electrically connected to the interconnect layer 14. The interconnect layer 16 includes a via interconnect filling the via hole 15x which penetrates the insulating layer 15 to expose a top surface of interconnect layer 14, and an interconnect pattern formed on a top surface of insulating layer 15. The via hole 15x may be a recess having an inverted truncated cone shape. A diameter of a first opening of the via hole 15x which opens at the insulating layer 17, may be greater than a diameter of a second opening of the via hole 15x which opens at the top surface of the interconnect layer 14. A bottom surface of the second opening of the via hole 15x is formed by the top surface of the interconnect layer 14. The first opening of the via hole 15x may have a diameter in a range of approximately 10 μm to approximately 20 μm, for example. A material used for the interconnect layer 16, and a thickness of the interconnect pattern forming the interconnect layer 16 may be similar to those of the interconnect layer 14, for example.

The line-and-space (L/S) of the interconnect layer 16 may be in a range of approximately 1 μm/1 μm to approximately 3 μm/3 μm, for example, but this line-and-space (L/S) may be narrower than that of the interconnect layer 14. In other words, the top surface 12a of the insulating layer 12 is a polished surface, and is smoother than the bottom surface 12b of the insulating layer 12. The top surface of the insulating layer 15 including the photosensitive resin as the main component thereof, is even smoother than the top surface 12a of the insulating layer 12 including the non-photosensitive thermosetting resin as the main component thereof. For this reason, the line-and-space (L/S) of the interconnect layer 16 can be made narrower than the line-and-space (L/S) of the interconnect layer 14. For example, the line-and-space (L/S) of the interconnect layer 14 may be 3 μm/3 μm, and the line-and-space (L/S) of the interconnect layer 16 may be 1 μm/1 μm. The same applies to the interconnect layer 18 which will be described later.

The insulating layer 17 is formed on one surface of the insulating layer 15, so as to cover the interconnect layer 16. A material used for the insulating layer 17, and a thickness and a thermal expansion coefficient of the insulating layer 17, may be similar to those of the insulating layer 15. The insulating layer 17 may include a filler, such as silica ($SiO_2$) or the like.

The interconnect layer 18 is formed on one side of the insulating layer 17, and is electrically connected to the interconnect layer 16. The interconnect layer 18 includes a via interconnect filling a via hole 17x which penetrates the insulating layer 17 to expose a top surface of the interconnect layer 16, and an interconnect pattern formed on the top surface of the insulating layer 17. The via hole 17x may be a recess having an inverted truncated cone shape. A diameter of a first opening of the via hole 17x which opens at the insulating layer 19, may be greater than a diameter of a second opening of the via hole 17x which opens at the top surface of the interconnect layer 16. A bottom surface of the second opening of the via hole 17x is formed by the top surface of the interconnect layer 16. The first opening of the via hole 17x may have a diameter in a range of approximately 10 μm to approximately 20 μm, for example. A material used for the interconnect layer 18, and a thickness of the interconnect pattern forming the interconnect layer 18 may be similar to those of the interconnect layer 14, for example. The line-and-space (L/S) of the interconnect layer 18 may be similar to that of the interconnect layer 16, for example.

The insulating layer 19 is formed on one surface of the insulating layer 17, so as to cover the interconnect layer 18. In the second interconnect structure 1H, the insulating layer 19 is an uppermost insulating layer. A material used for the insulating layer 19, and a thickness and a thermal expansion coefficient of the insulating layer 19, may be similar to those of the insulating layer 15, for example. The insulating layer 19 may include a filler, such as silica ($SiO_2$) or the like.

The thin film capacitor 20 is laminated to one surface of the insulating layer 19. The thin film capacitor 20 is a sheet capacitor having a thickness of approximately 50 μm, and includes a dielectric 21, a first electrode 22, a second electrode 23, and an adhesive layer 24, for example. The first electrode 22 is formed on one surface of the dielectric 21, and is connected to a ground of a circuit, for example. The second electrode 23 is formed on the other surface of the dielectric 21, and is connected to a power supply of the circuit, for example. The adhesive layer 24 is formed on the other surface of the dielectric 21, so as to cover the second electrode 23, and is bonded to the insulating layer 19. Examples of a material used for the dielectric 21 include barium titanate or the like, for example. Examples of a material used for the first electrode 22 and the second electrode 23 include copper or the like, for example.

The interconnect layer 31 is formed on one surface of thin film capacitor 20, and is electrically connected to the thin film capacitor 20. In the second interconnect structure 1H, the interconnect layer 31 is an uppermost interconnect layer. The interconnect layer 31 includes a via interconnect 32, and a plurality of pads 33 protruding from the top surface side of the thin film capacitor 20. The via interconnect 32 fills an inside of a via hole 20x that penetrates the thin film capacitor 20, and fills an inside of a via hole 19x that penetrates the insulating layer 19 and exposes the top surface of the interconnect layer 18.

The via interconnect 32 is formed continuously with the pad 33, and is electrically connected to the interconnect layer 18. A portion of the via interconnect 32 penetrates the dielectric 21 and the first electrode 22 of the thin film capacitor 20, or the second electrode 23 and the adhesive layer 24 of the thin film capacitor 20. In other words, the first electrode 22 and the second electrode 23 are electrically connected to the interconnect layer 18 through the via interconnect 32. A large capacitor structure can be formed as a whole, by including the via interconnect 32 that makes the electrical connection with the interconnect layer 18 by penetrating the first electrode 22, and the via interconnect 32 that makes the electrical connection by penetrating the second electrode 23.

The via hole 19x may be a recess having an inverted truncated cone shape. A diameter of a first opening of the via hole 19x which opens at the adhesive layer 24 of the thin film capacitor 20, may be greater than a diameter of a second opening of the via hole 19x which opens at the top surface of the interconnect layer 18. A bottom surface of the second opening of the via hole 19x is formed by the top surface of the interconnect layer 18. The first opening of the via hole 19x may have a diameter in a range of approximately 10 μm to approximately 20 μm, for example.

The via hole 20x communicates with the via hole 19x. The via hole 20x has a cylindrical shape with openings having an approximately constant diameter. A diameter of the openings of the via hole 20x is greater than the diameter of the first opening of the via hole 19x. The diameter of the openings the via hole 20x may be in a range of approximately 20 μm to approximately 40 μm, for example.

A material used for the interconnect layer 31 may be similar to that of the interconnect layer 14, for example. A thickness of the interconnect layer 31, that is, a sum of the thickness of the via interconnect 32 and the thickness of the pad 33, may be approximately 10 μm, for example. A planar shape of the pad 33 may be a circular shape with a diameter of in a range of approximately 20 μm to approximately 30 μm, for example. A pitch of the pad 33 may be in a range of approximately 40 μm to approximately 50 μm, for example. A size relationship between the diameter of the pad 33 and the diameter of the openings of the via hole 20x can be determined arbitrarily. A portion of the pad 33, that is exposed from the encapsulating resin layer 34, may be used as an external connection terminal for making electrical connection with a semiconductor chip.

A surface treatment layer 310, similar to the surface treatment layer 110, may be formed on a top surface of the pad 33. In a case where a portion of a side surface and the top surface of the pad 33 protrude from the top surface 34a of the encapsulating resin layer 34, the surface treatment layer 310 is formed on only the top surface of the pad 33, or on a portion of the side surface and the top surface of the pad 33.

The encapsulating resin layer 34 is laminated on the thin film capacitor 20, to expose the top surface of each pad 33, and to cover at least a portion of the side surface of each pad 33. The encapsulating resin layer 34 may expose the top surface of the pad 33, and cover the entire side surface of the pad 33. In this case, the top surface of the pad 33 coincides with the top surface 34a of the encapsulating resin layer 34, for example. However, a portion of the side surface and the top surface of the pad 33 may protrude from the top surface 34a of the encapsulating resin layer 34, and the top surface of the pad 33 may be exposed at a position recessed from the top surface 34a of the encapsulating resin layer 34. In the case where a portion of the side surface and the top surface of the pad 33 protrude from the top surface 34a of the encapsulating resin layer 34, a spacing can be secured between the encapsulating resin layer 34 and the semiconductor chip, so that an underfill resin can easily be filled between the encapsulating resin layer 34 and the semiconductor chip.

Examples of a material used for the encapsulating resin layer 34 include a mold resin, for example. The mold resin is an insulating resin including a non-photosensitive thermosetting resin as a main component thereof, which may be used for methods such as transfer molding, compression molding, injection molding, or the like. The mold resin is an insulating resin, such as a non-photosensitive thermosetting epoxy resin or the like, for example, and may include a filler similar to that of the insulating layer 12, but does not include a reinforcing member such as glass fiber or the like.

From a viewpoint of reducing a warp of the wiring board 1, a thickness of the encapsulating resin layer 34 is preferably greater than the thickness of the insulating layer 12. For example, when the thickness of the insulating layer 12 is in a range of 60 μm to 70 μm, the thickness of the encapsulating resin layer 34 may be in a range of 80 μm to 150 μm. A thermal expansion coefficient of the encapsulating resin layer 34 is lower than the thermal expansion coefficient of each of the insulating layers 15, 17, and 19. For sake of convenience of distinguishably illustrating the elements in the drawings, the thickness of the encapsulating resin layer 34 in FIG. 1A is illustrated as if the thickness of the encapsulating resin layer 34 is smaller than the thickness of the insulating layer 12.

In addition, from the viewpoint of reducing the warp of the wiring board 1, the thermal expansion coefficient of the encapsulating resin layer 34 is preferably approximately the same as the thermal expansion coefficient of the insulating layer 12. Herein, "approximately the same" means that the thermal expansion coefficient of the encapsulating resin layer 34 is ±20% or less with respect to the thermal expansion coefficient of the insulating layer 12.

For example, when the thermal expansion coefficient of the insulating layer 12 is in a range greater than or equal to 5 ppm/° C. and less than or equal to 10 ppm/° C., the thermal expansion coefficient of the encapsulating resin layer 34 is preferably in a range greater than or equal to 5 ppm/° C. and less than or equal to 10 ppm/° C. The thermal expansion coefficient of the encapsulating resin layer 34 may be adjusted to a predetermined value by a filler content, a composition of the insulating resin, or the like, for example.

[Method for Manufacturing Wiring Board according to First Embodiment]

Next, a method for manufacturing the wiring board according to the first embodiment will be described. FIG. 2A through FIG. 7B are diagrams illustrating an example of a manufacturing process of the wiring board according to the first embodiment. Although the manufacturing process of one wiring board is illustrated in this example, the manufacturing process may form a plurality of parts which become wiring boards, and thereafter singulate the plurality of wiring boards to form each wiring board. In addition, although the layer structure is formed only on one side of a support in this example, the layer structure may be formed on both the one side and the other side of the support.

Figure 2A:
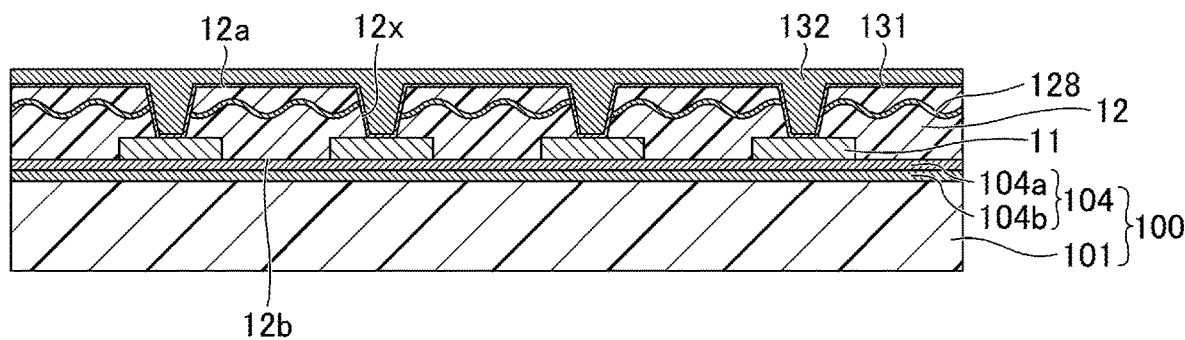
FIG. 2A, FIG. 2B, and FIG. 2C are diagrams (part 1) illustrating an example of a manufacturing process of the wiring board according to the first embodiment.

First, in the process illustrated in FIG. 2A, a support 100 is prepared, the interconnect layer 11 and the insulating layer 12 are famed on the support 100, the via hole 12x is formed in the insulating layer 12, and a laminated structure of a seed layer 131 and an electrolytic plating layer 132 is formed on the insulating layer 12 inside the via hole 12x.

The support 100 has a laminated structure in which a carrier-added copper film 104 is laminated on one side of a core substrate 101, for example. The core substrate 101 is a resin substrate having a thickness of approximately 0.7 mm, for example, and the resin substrate and may include a reinforcing member, such as a glass fiber or the like. The carrier-added copper film 104 has a structure in which a thin film 104a made of copper and having a thickness in a range of approximately 1.5 μm to approximately 5 μm, for example, is attached to a thick film (carrier film) 104b made of copper and having a thickness in a range of approximately 10 μm to approximately 50 μm, for example, via a release layer (not illustrated), in a state where the thin film 104a is strippable. The thick film 104b is provided as a support material to facilitate handling of the thin film 104a.

The structure of the support 100 described above is merely an example, and the structure of the support 100 is not particularly limited. For example, the support 100 may use a laminated body in which a plurality of prepregs are laminated, in place of the core substrate 101. In addition, the support 100 may have a structure, in which the carrier-added copper film 104 is arranged on one side of a substrate, such as a glass substrate, a metal substrate, or the like, via a release layer.

Once the support 100 is prepared, the interconnect layer 11 is first formed on one side of the support 100. More particularly, a resist layer having an opening in a portion where the interconnect layer 11 is to be formed, is formed on the top surface of the carrier-added copper film 104 (top surface of the thin film 104a) using a dry film resist or the like. Then, the interconnect layer 11, which is an electrolytic plating layer, is formed on the top surface of the carrier-added copper film 104 exposed inside the opening, by electrolytic plating using the carrier-added copper film 104 as a power feeding layer. The material used for the interconnect layer 11, and the thickness of the interconnect layer 11 are as described above. Thereafter, the resist layer is stripped.

Next, the insulating layer 12 covering the interconnect layer 11 is formed on the top surface of the carrier-added copper film 104. More particularly, a film of an insulating resin in a semi-cured state, including a non-photosensitive thermosetting resin as a main component thereof, and a reinforcing member 128, is prepared. The insulating resin is then laminated to the top surface of the carrier-added copper film 104, and is cured while being heated and pressed, to thereby form the insulating layer 12. The material used for the insulating layer 12, and the thickness, the thermal expansion coefficient, or the like of the insulating layer 12, are as described above.

Next, the via hole 12x, that penetrates the insulating layer 12 and exposes the top surface of the interconnect layer 11, is formed in the insulating layer 12. The via hole 12x may be formed by a laser beam machining using a $CO_2$ laser, a YAG laser, an excimer laser, or the like, for example. After forming the via hole 12x, a desmear treatment is preferably performed to remove resin residue adhered to the surface of the interconnect layer 11 exposed at the bottom of each via hole 12x.

Next, a laminated structure of the seed layer 131 and the electrolytic plating layer 132 is formed on the top surface 12a of the insulating layer 12 inside the via hole 12x, using a semi-additive method, for example. More particularly, the seed layer 131 is first formed on the top surface 12a of the insulating layer 12, the inner sidewall surface of the via hole 12x, and the top surface of the interconnect layer 11 exposed inside the via hole 12x, by electroless plating or sputtering. A copper layer having a thickness in a range of approximately 100 nm to approximately 350 nm, for example, may be used for the seed layer 131. In addition, a laminated layer in which a titanium layer having a thickness in a range of approximately 20 nm to approximately 50 nm, and a copper layer having a thickness of approximately 100 nm to approximately 300 nm, for example, are laminated in this order, may be used for the seed layer 131. By forming the titanium layer in a lower layer portion of the seed layer 131, it is possible to improve the adhesion between the insulating layer 12 and the interconnect layer 13. Titanium nitride or the like may be used in place of the titanium forming the lower layer portion of the seed layer 131. Titanium and titanium nitride are metals having a higher corrosion resistance than copper. Then, the electrolytic plating layer (for example, a copper layer) 132 is formed on the seed layer 131 by electrolytic plating using the seed layer 131 as a power feeding layer.

Figure 2B:
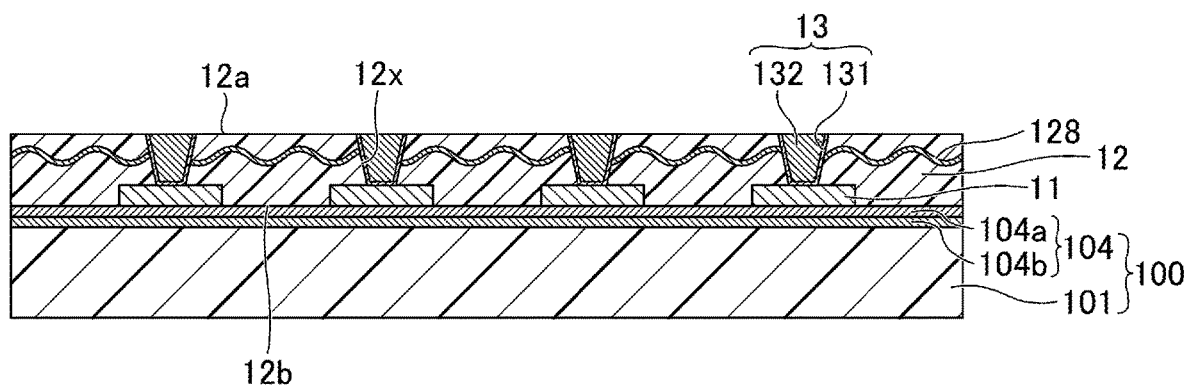

Next, in the process illustrated in FIG. 2B, a top surface of the laminated structure of the seed layer 131 and the electrolytic plating layer 132 illustrated in FIG. 2A is polished to expose the top surface 12a of the insulating layer 12, thereby forming the interconnect layer 13 which is the via interconnect filling the via hole 12x. A Chemical Mechanical Polishing (CMP) or the like, for example, may be used for the polishing of the interconnect layer 13. The top surface of the interconnect layer 13 may coincide with the top surface 12a of the insulating layer 12, for example.

When polishing the interconnect layer 13, a portion of the top surface 12a of the insulating layer 12 may be polished and removed simultaneously therewith. By polishing the top surface 12a of the insulating layer 12 together with the interconnect layer 13 and removing a portion of the top surface 12a of the insulating layer 12, the roughness of the top surface 12a of the insulating layer 12 can be reduced compared to that before the polishing. In other words, it is possible to improve the smoothness of the top surface 12a of the insulating layer 12. The roughness Ra of the top surface 12a of the insulating layer 12 before performing the CMP (before polishing) is in a range of approximately 300 nm to approximately 400 nm, for example. After performing the CMP, the roughness Ra of the top surface 12a of the insulating layer 12 is in a range of approximately 15 nm to approximately 40 nm. Accordingly, by reducing the roughness and improving the smoothness of the top surface 12a of the insulating layer 12, it becomes possible to form a fine-line interconnect (interconnect layer having a high interconnect density) at a later stage of the manufacturing process. The roughness Ra of the bottom surface 12b of the insulating layer 12 is in a range of approximately 180 nm to approximately 280 nm, for example.

Figure 2C:
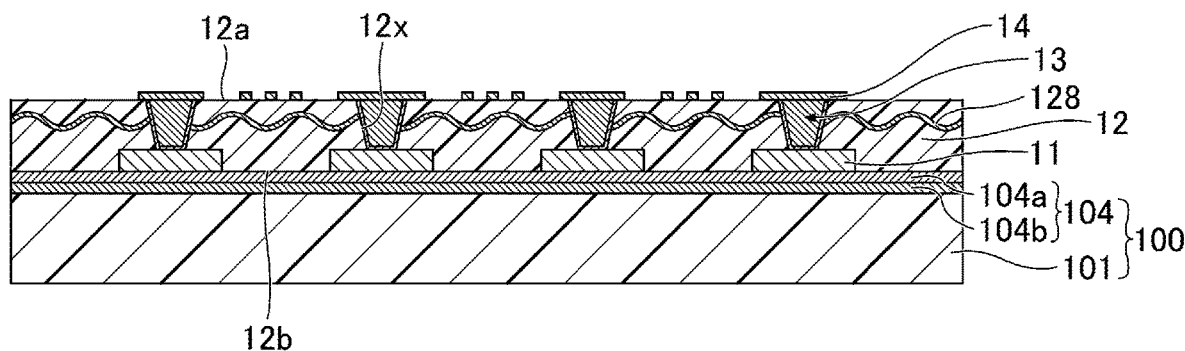

Next, in the process illustrated in FIG. 2C, the interconnect layer 14 having a predetermined pattern is formed on the top surface of the interconnect layer 13 and the top surface 12a of the insulating layer 12. The interconnect layer 14 may be formed using a semi-additive method, similar to the interconnect layer 13. More particularly, a seed layer is first formed by electroless plating or sputtering, so as to continuously cover the top surface of the interconnect layer 13 and the top surface 12a of the insulating layer 12. Although the electroless plating may be used to form the seed layer, it is more advantageous to use the sputtering from a viewpoint of increasing the density of the interconnect layer, because the seed layer can be made thinner by the sputtering.

Then, a photosensitive resist layer is formed on the entire top surface of the seed layer, and the resist layer is exposed and developed, to thereby form an opening exposing a portion where the interconnect layer 14 is to be formed. Next, an electrolytic plating layer is foisted on the top surface of the seed layer exposed inside the opening, by electrolytic plating using the seed layer as a power feeding layer. Then, after stripping the resist layer, the electrolytic plating layer is used as a mask, to remove a portion of the seed layer not covered by the electrolytic plating layer by etching. Hence, the interconnect layer 14, having the electrolytic plating layer laminated on the seed layer, is formed. The material used for the interconnect layer 14, and the thickness, the line-and-space (L/S), or the like of the interconnect layer 14, are as described above. Although the interconnect layer 14 has the laminated structure in which the electrolytic plating layer is laminated on the seed layer, illustration of the seed layer and the electrolytic plating layer in a distinguishable manner is omitted (the same may apply to other interconnect layers) in FIG. 2C or the like.

Figure 3A:
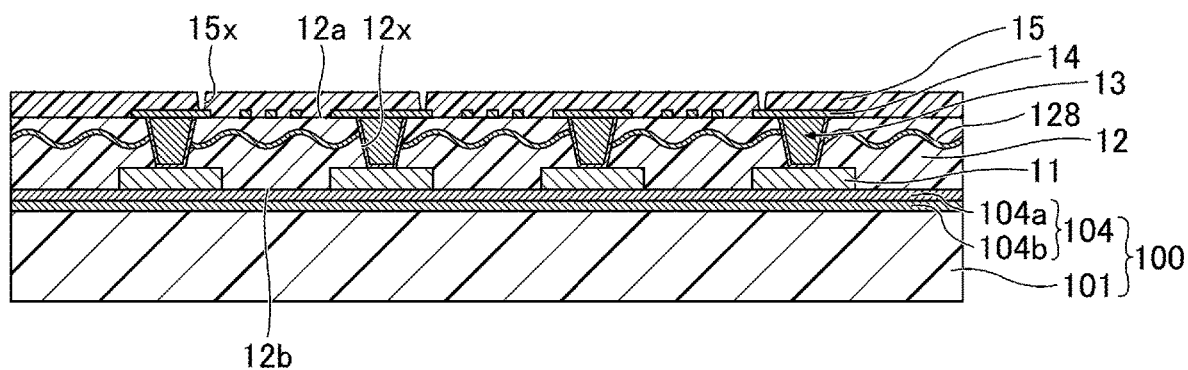
FIG. 3A and FIG. 3B are diagrams (part 2) illustrating the example of the manufacturing process of the wiring board according to the first embodiment.

Next, in the process illustrated in FIG. 3A, after a photosensitive resin in a liquid or paste form is coated on the top surface 12a of the insulating layer 12 so as to cover the interconnect layer 14, the photosensitive resin is heated to a temperature that does not cause complete curing of the photosensitive resin, to thereby form the semi-cured insulating layer 15. The material used for the insulating layer 15, and thickness of the insulating layer 15 are as described above. Next, after feinting the via hole 15x by photolithography, for example, the insulating layer 15 is heated to a temperature higher than or equal to a curing temperature of the photosensitive resin, so as to cure the insulating layer 15. The top surface of the insulating layer 15 including the photosensitive resin as the main component thereof is even smoother than the top surface 12a of the insulating layer 12. The roughness Ra of the top surface of the insulating layer 15 may be in a range of approximately 2 nm to approximately 6 nm, for example.

Figure 3B:
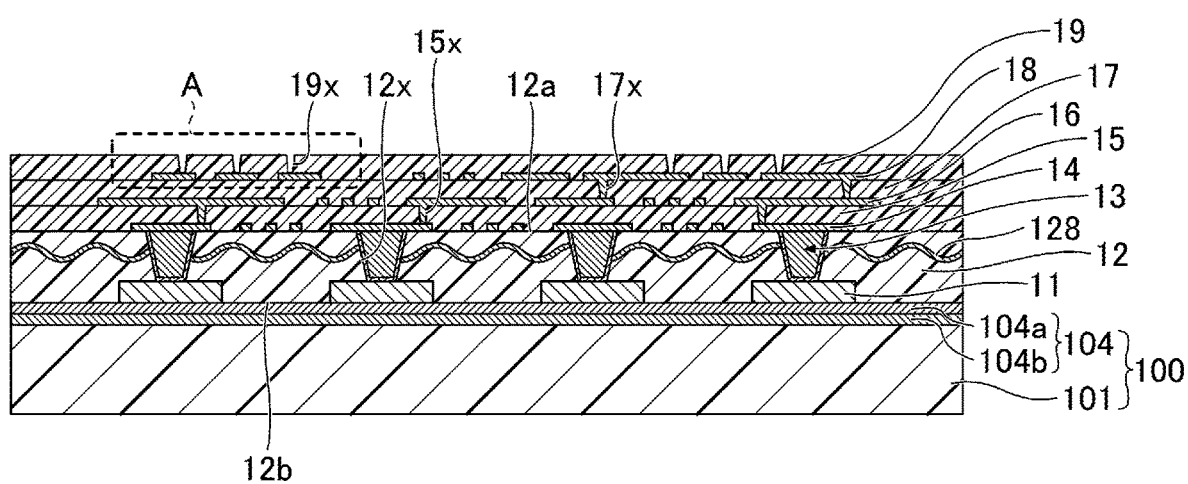

Next, in the process illustrated in FIG. 3B, the interconnect layer 16, the insulating layer 17, the interconnect layer 18, and the insulating layer 19 are formed by repeating processes similar to those illustrated in FIG. 2C and FIG. 3A. Thereafter, the via hole 19x, that penetrates the insulating layer 19, and exposes the top surface of the interconnect layer 18 inside the via hole 19x, is formed. In processes illustrated in FIG. 4A through FIG. 6B which will be described later, a description will be given with reference to an enlarged vide of a part A illustrated in FIG. 3B.

Figure 4A:
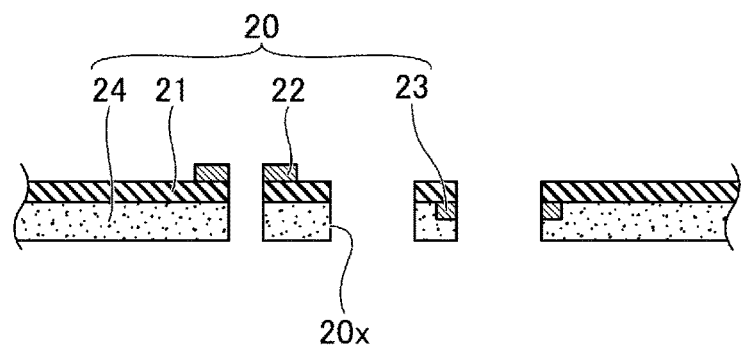
FIG. 4A, FIG. 4B, and FIG. 4C are diagrams (part 3) illustrating the example of the manufacturing process of the wiring board according to the first embodiment.

Next, in the process illustrated in FIG. 4A, the thin film capacitor 20 is prepared, and a plurality of via holes 20x is formed in the thin film capacitor 20 by laser beam machining or the like. The plurality of via holes 20x includes at least a via hole that opens the first electrode 22, and a via hole that opens the second electrode 23. The diameters of each of the via holes 20x do not necessarily have to be the same.

Figure 4B:
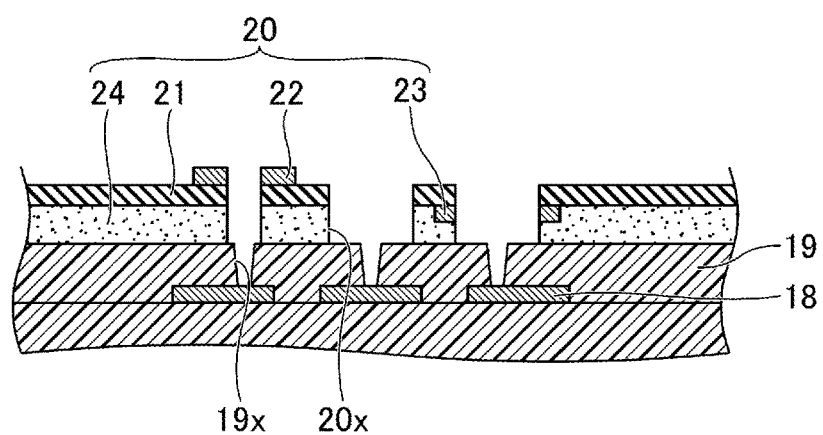

Next, in the process illustrated in FIG. 4B, the thin film capacitor 20 is arranged on the insulating layer 19, in a state where the adhesive layer 24 faces the insulating layer 19. In this case, the via hole 19x and the via hole 20x communicate with each other. Then, the adhesive layer 24 is cured by a heat treatment or the like, to fix the thin film capacitor 20, on the insulating layer 19.

Figure 4C:
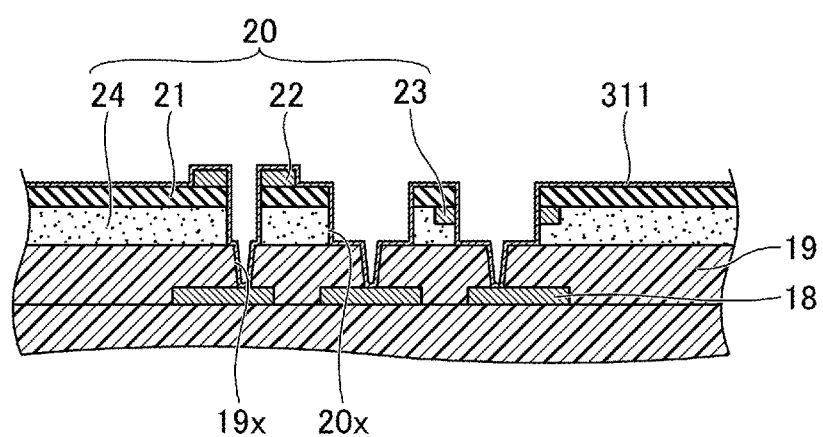

Next, in the processes illustrated in FIG. 4C through FIG. 5C, the interconnect layer 31 is formed by a semi-additive method, for example. First, as illustrated in FIG. 4C, a seed layer 311 is formed on the top surface of the dielectric 21, the top surface and the side surface of the first electrode 22, inner surfaces defining the vias holes 19x and 20x, respectively, and the top surface of the interconnect layer 18 exposed inside the via holes 19x, by electroless plating or sputtering. The seed layer 311 may be a copper layer having a thickness in a range of approximately 100 nm to approximately 350 nm, for example.

Figure 5A:
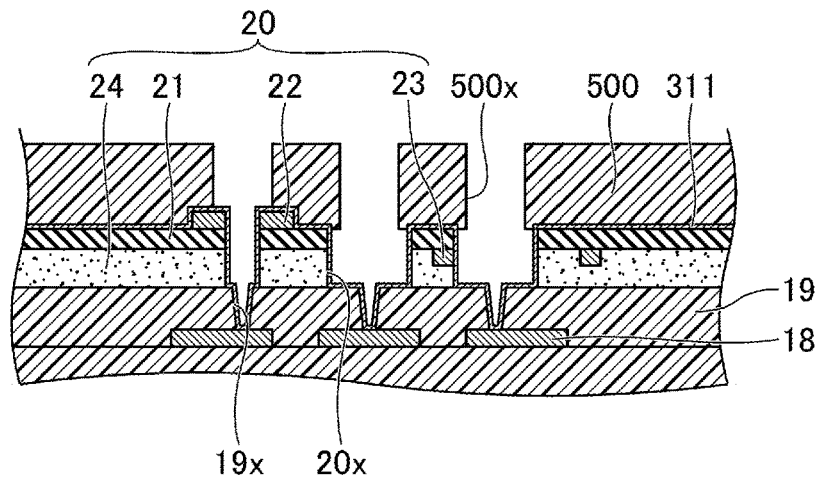
FIG. 5A, FIG. 5B, and FIG. 5C are diagrams (part 4) illustrating the example of the manufacturing process of the wiring board according to the first embodiment.

Next, in the process illustrated in FIG. 5A, a photosensitive resist layer 500 is formed on the seed layer 311, the resist layer 500 is exposed and developed, and an opening 500x is formed to expose a portion where the interconnect layer 31 is to be formed. The resist layer 500 can be formed by laminating a dry film resist on the seed layer 311, for example.

Figure 5B:
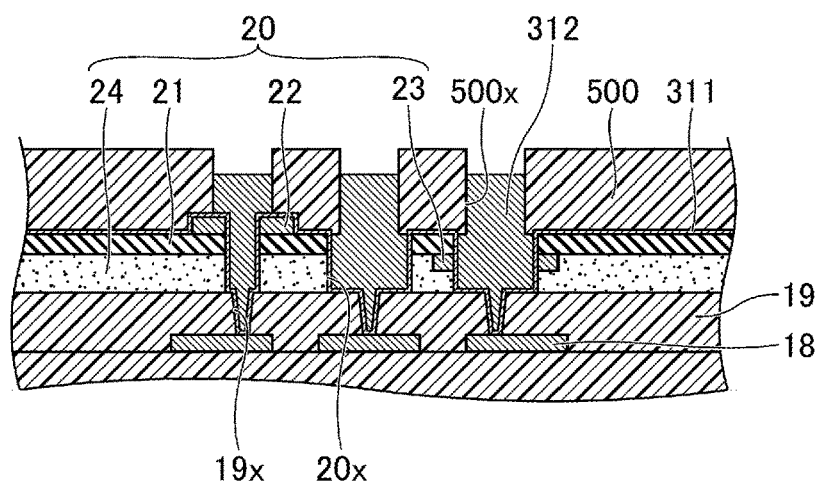

Next, in the process illustrated in FIG. 5B, an electrolytic plating layer 312 (for example, a copper layer) is formed on the seed layer 311 exposed inside the opening 500x, by electrolytic plating utilizing the seed layer 311 as a power feeding layer. Further, in the process illustrated in FIG. 5C, after the resist layer 500 is stripped, the electrolytic plating layer 312 is used as a mask, and a portion of the seed layer 311, that is not covered by the electrolytic plating layer 312, is removed by etching. Hence, the interconnect layer 31, formed from the seed layer 311 and the electrolytic plating layer 312 illustrated in FIG. 5B, and including the via interconnect 32 that fills the insides of the via holes 19x and 20x, and the pad 33 protruding from the top surface side of the thin film capacitor 20, is formed.

Figure 5C:
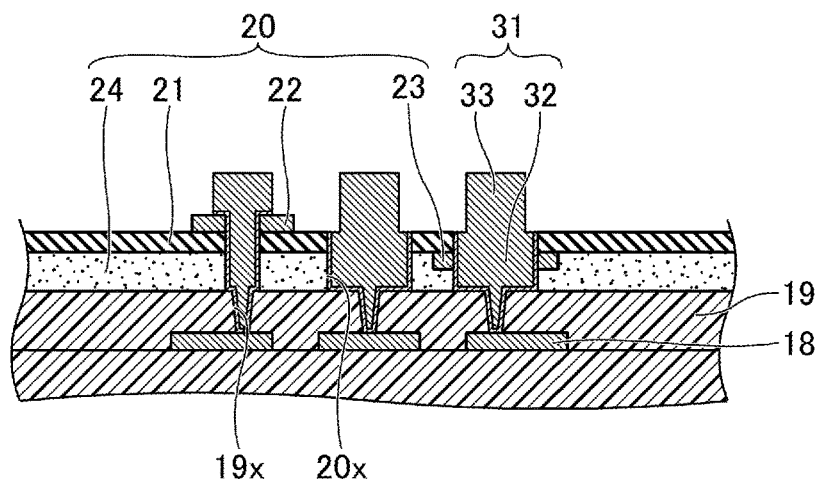
Figure 6A:
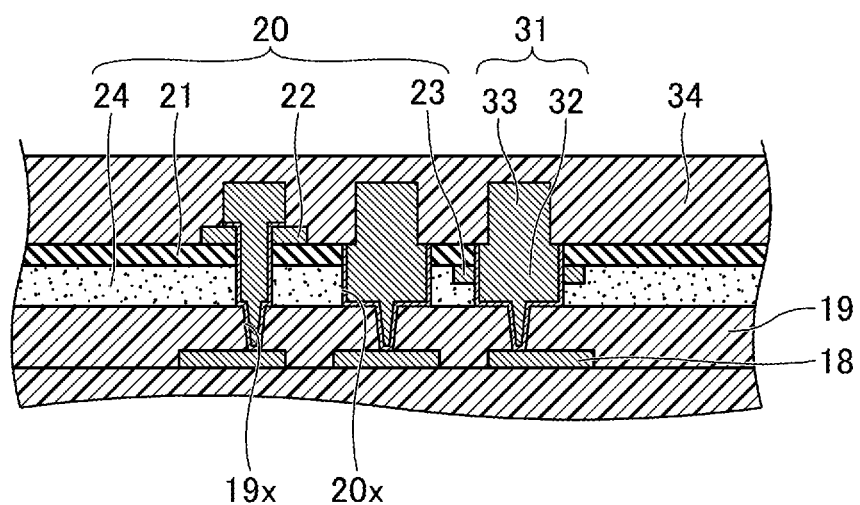
FIG. 6A and FIG. 6B are diagrams (part 5) illustrating the example of the manufacturing process of the wiring board according to the first embodiment.

Next, in the process illustrated in FIG. 6A, the encapsulating resin layer 34 is formed on the thin film capacitor 20, so as to cover the top surface and the side surface of the pad 33 of the interconnect layer 31. The encapsulating resin layer 34 may be formed by mold forming using a mold resin, for example. For example, the structure illustrated in FIG. 5C is accommodated within a mold, and the fluidized mold resin is introduced into the mold by applying a pressure in a range of 5 MPa to 10 MPa, for example. Thereafter, the mold resin is heated to a temperature of approximately 180° C. and cured, to thereby form the encapsulating resin layer 34. After the required encapsulation process is completed, the structure covered with the encapsulating resin layer 34 is removed from the mold. The mold forming may use transfer molding, compression molding, injection molding, or the like, for example.

Figure 6B:
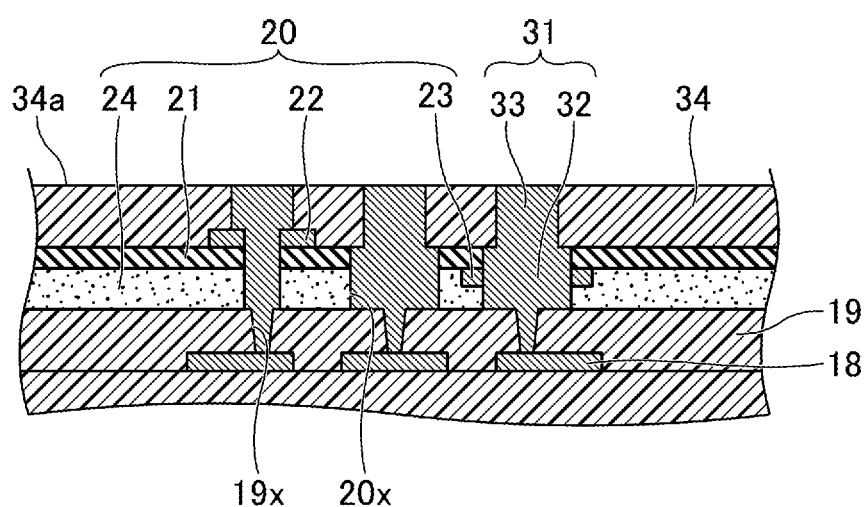

Next, in the process illustrated in FIG. 6B, top surface of the encapsulating resin layer 34 illustrated in FIG. 6A is polished, to expose at least the top surface of the pad 33. The CMP or the like, for example, may be used to polish the encapsulating resin layer 34. The top surface of the pad 33 may coincide with the top surface 34a of the encapsulating resin layer 34, for example. However, by adjusting a polishing amount of the encapsulating resin layer 34 or the like, a portion of the side surface and the top surface of the pad 33 may protrude from the top surface 34a of the encapsulating resin layer 34, or the top surface of the pad 33 may be exposed at a more recessed position than the top surface 34a of the encapsulating resin layer 34.

Figure 7A:
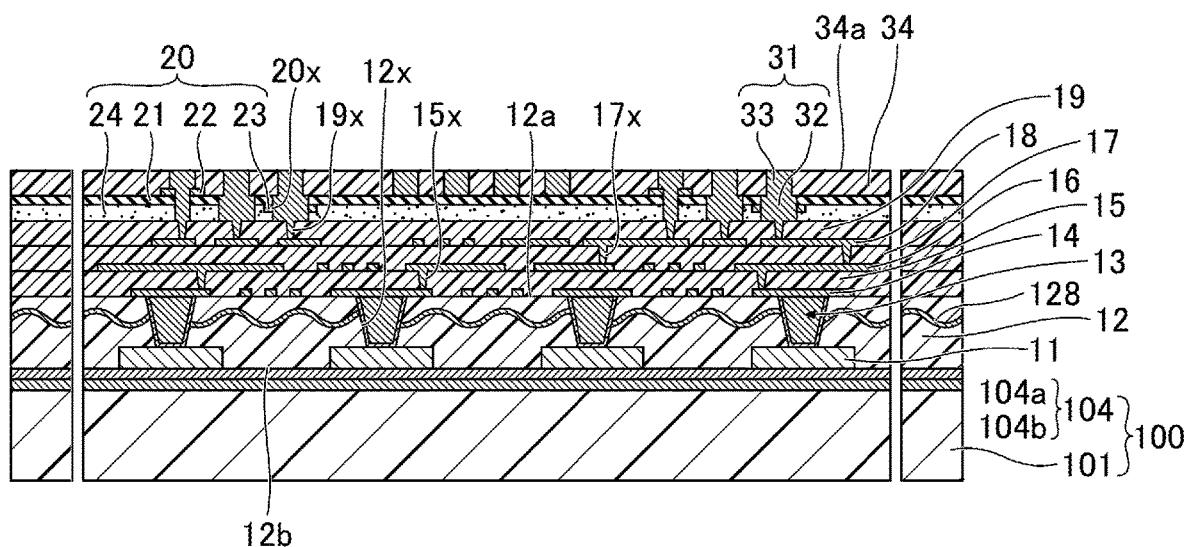
FIG. 7A and FIG. 7B are diagrams (part 6) illustrating the example of the manufacturing process of the wiring board according to the first embodiment.
Figure 7B:
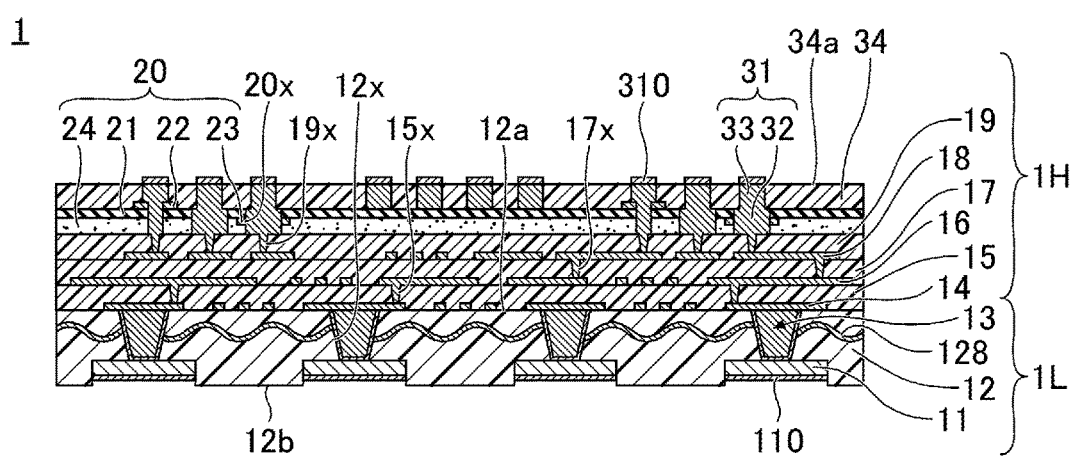

Next, in the process illustrated in FIG. 7A, an outer periphery of the entire structure illustrated in FIG. 6B is cut using a dicing blade or the like. Next, in the process illustrated in FIG. 7B, the support 100 illustrated in FIG. 7A is removed, the surface treatment layer 310 is formed on the top surface of the pad 33, as required, and the surface treatment layer 110 is formed on the bottom surface of the interconnect layer 11, as required. In order to remove the support 100, the core substrate 101 and thick film 104b are first mechanically stripped from the thin film 104a. Then, the thin film 104a is removed by wet etching using an aqueous ferric chloride solution, an aqueous copper chloride solution, an aqueous ammonium persulfate solution, or the like, for example. In this state, when the interconnect layer 11 is made of copper, the bottom surface of the interconnect layer 11 is also etched, and the bottom surface of the interconnect layer 11 becomes recessed from the bottom surface 12b of the insulating layer 12 toward the interconnect layer 13. The surface treatment layers 110 and 310 may be a metal layer or a laminated structure of metal layers described above formed by electroless plating, for example, or may be formed by an anti-oxidation treatment, such as the OSP treatment or the like.

As described above, in the wiring board 1, the thin film capacitor 20 is disposed immediately under the pad 33. Because the pad 33 is used as the external connection terminal for making electrical connection with the semiconductor chip, when the semiconductor chip is mounted on the wiring board 1, the thin film capacitor 20 is arranged at a position close to the semiconductor chip. For this reason, it is possible to reduce an equivalent series inductance of the thin film capacitor 20, and enable the semiconductor chip to operate at a high frequency of 100 MHz or higher, for example.

Moreover, in the wiring board 1, the encapsulating resin layer 34 is laminated on the thin film capacitor 20, so as to expose the top surface of the pad 33, and to cover at least a portion of the side surface of the pad 33. When mounting the semiconductor chip on the wiring board 1, the pad 33 and an electrode pad of the semiconductor chip are connected by a solder. If the thin film capacitor were exposed at the surface of the wiring board, there is a risk of the thin film capacitor cracking due to thermal stress and pressure generated when mounting the semiconductor chip. However, because the wiring board 1 has a structure in which the encapsulating resin layer 34 is laminated on the thin film capacitor 20, it is possible to reduce damage to the thin film capacitor 20 by this structure which reduces the thermal stress and pressure generated when mounting the semiconductor chip from easily affecting the thin film capacitor 20.

In the wiring board 1, because the top surface of the encapsulating resin layer 34 is polished to expose the top surface of the pad 33, heights of the top surfaces of the plurality of pads 33 become uniform. Here, a uniform height of the pads refers to a case where the height of a highest pad is +10 μm with respect to the height of a lowest pad. In addition, because the plurality of pads 33 exposed from the encapsulating resin layer 34 has a uniform top surface area and a polished smooth surface, wetting and spread of the solder become constant when mounting the semiconductor chip, to thereby improve a mounting reliability of the semiconductor chip. Here, a uniform top surface area of the pads refers to a case where a largest top surface area of the pad is +20% with respect to a smallest top surface area of the pad.

Because the conventional wiring board does not polish the pads by CMP, the height of the pads vary. Moreover, in the conventional wiring board, the entire side surface of the pad is exposed. For this reason, the wetting and spreading of the solder extend to the side surface of the pads having a low height, thereby causing a problem such as an insufficient amount of solder on the top surface of the pads, or the like. In contract, such a problem is eliminated according to the wiring board 1.

Further, in the wiring board 1, the first interconnect structure it including the insulating layer 12 having the non-photosensitive thermosetting resin as the main component thereof, and the encapsulating resin layer 34 having the non-photosensitive thermosetting resin as the main component thereof, are disposed on both sides of the second interconnect structure 1H including the insulating layers 15, 17, and 19 having the photosensitive resin as the main component thereof, to sandwich the second interconnect structure 1H therebetween. The thermal expansion coefficient of the insulating layer 12 and the thermal expansion coefficient of the encapsulating resin layer 34 are lower than the thermal expansion coefficient of each of the insulating layers 15, 17, and 19. Because this structure improves the imbalance of the thermal expansion coefficients in the thickness direction of the wiring board 1, it is possible to reduce the warp of the wiring board 1.

In addition, because the warp of the wiring board 1 is reduced, it is easy to mount the semiconductor chip on the side of the wiring board 1 provided with the encapsulating resin layer 34, and to mount the wiring board 1 on other wiring boards.

The structure in the state illustrated in FIG. 7A before the cutting may be the form in which the wiring board is forwarded. In other words, the wiring board 1 may be forwarded in the state including the support 100.

First Application Example of First Embodiment

A first application example of the first embodiment illustrates an example of a laminated wiring board in which the wiring board according to the first embodiment is mounted on another wiring board. In the first application example of the first embodiment, a description of constituent elements that are the same as those of the embodiment already described above may be omitted.

Figure 8:
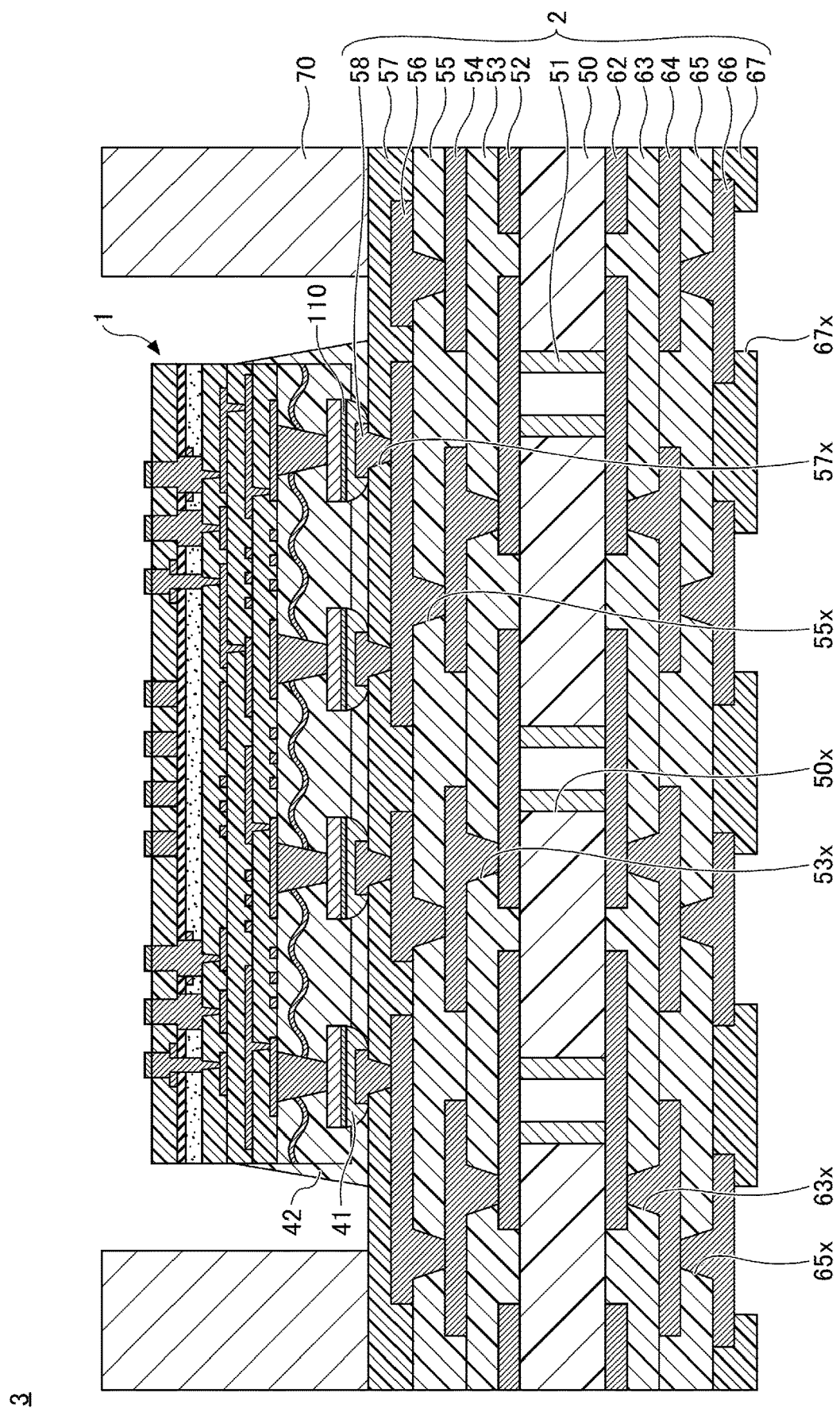
FIG. 8 is a cross sectional view illustrating an example of a laminated wiring board according to a first application example of the first embodiment.

FIG. 8 is a cross sectional view illustrating the laminated wiring board according to the first application example of the first embodiment. As illustrated in FIG. 8, a laminated wiring board 3 is a multi-layer (or multi-level) wiring board including the wiring board 1 mounted on a wiring board 2.

The wiring board 2 is a multi-layer wiring board having an interconnect layer and an insulating layer laminated on both surfaces of a core layer 50, and may be manufactured by a known build-up method, for example. Each interconnect layer of the wiring board 2 has a lower interconnect density (or wider line-and-space (L/S)) than the interconnect layers 14, 16, 18, and 31 of the wiring board 1. The line-and-space (L/S) of each interconnect layer of the wiring board 2 may be approximately 20 µm/20 µm, for example.

In the wiring board 2, an interconnect layer 52, an insulating layer 53, an interconnect layer 54, an insulating layer 55, an interconnect layer 56, a solder resist layer 57, and an interconnect layer 58 are successively laminated on one surface of the core layer 50. In addition, an interconnect layer 62, an insulating layer 63, an interconnect layer 64, an insulating layer 65, an interconnect layer 66, and a solder resist layer 67 are successively laminated on the other surface of the core layer 50.

A so-called glass epoxy substrate or the like, including glass cloth impregnated with an insulating resin, such as an epoxy-based resin or the like, may be used for the core layer 50. A substrate or the like, including unwoven or woven fabric, such as glass fiber, carbon fiber, aramid fiber, or the like, impregnated with an epoxy-based resin, a polyimide-based resin, or the like, may also be used for the core layer 50. The core layer 50 may have a thickness in a range of approximately 60 µm to approximately 400 µm, for example. The core layer 50 includes a through hole 50*x* that penetrates the core layer 50 in a thickness direction thereof. A planar shape of the through hole 50*x* may be a circular shape, for example.

An interconnect layer 52 is formed on one surface of the core layer 50. In addition, an interconnect layer 62 is formed on the other surface of the core layer 50. The interconnect layer 52 and the interconnect layer 62 are electrically connected through a penetrating interconnect 51 formed inside the through hole 50*x*. The interconnect layers 52 and 62 are patterned into predetermined planar shapes, respectively. Examples of a material used for the interconnect layers 52 and 62 and the penetrating interconnect 51 include copper (Cu) or the like, for example. The interconnect layers 52 and 62 may have a thickness in a range of approximately 10 µm to approximately 30 µm, for example. The interconnect layer 52, the interconnect layer 62, and the penetrating interconnect 51 may be integrally formed.

An insulating layer 53 is formed on one surface of the core layer 50, so as to cover the interconnect layer 52. Examples of a material used for the insulating layer 53 include non-photosensitive thermosetting insulating resins including an epoxy-based resin or a polyimide-based resin as a main component thereof, for example. The insulating layer 53 may have a thickness in a range of approximately 30 µm to approximately 40 µm, for example. The insulating layer 53 may include a filler, such as silica ($SiO_2$) or the like.

An interconnect layer 54 is formed on one surface of the insulating layer 53. The interconnect layer 54 includes a via interconnect filling inside a via hole 53*x* that penetrates the insulating layer 53 to expose a top surface of interconnect layer 52, and an interconnect pattern formed on a top surface of insulating layer 53. The interconnect pattern forming the interconnect layer 54 is electrically connected to the interconnect layer 52 through the via interconnect. The via hole 53*x* may be a recess having an inverted truncated cone shape. A diameter of a first opening of the via hole 53*x* which opens at the insulating layer 55, may be greater than a diameter of a second opening of the via hole 53*x* which opens at the top surface of the interconnect layer 52. A bottom surface of the second opening of the via hole 53*x* is formed by the top surface of the interconnect layer 52. A material used for the interconnect layer 54 and a thickness of the interconnect pattern of the interconnect layer 54 may be similar to those of the interconnect layer 52, for example.

An insulating layer 55 is famed on a top surface of the insulating layer 53, so as to cover the interconnect layer 54. A material used for the insulating layer 55 and a thickness of the insulating layer 55 may be similar to those of the insulating layer 53, for example. The insulating layer 55 may include a filler, such as silica ($SiO_2$) or the like.

An interconnect layer 56 is formed on one surface of the insulating layer 55. The interconnect layer 56 includes a via interconnect filling inside a via hole 55*x* that penetrates the insulating layer 55 to expose a top surface of interconnect layer 54, and an interconnect pattern formed on a top surface of insulating layer 55. The interconnect pattern forming the interconnect layer 56 is electrically connected to the interconnect layer 54 through the via interconnect. The via hole 55*x* may be a recess having an inverted truncated cone shape. A diameter of a first opening of the via hole 55*x* which opens at the solder resist layer 57, may be greater than a diameter of a second opening of the via hole 55*x* which opens at the top surface of the interconnect layer 54. A bottom surface of the second opening of the via hole 55*x* is formed by the top surface of the interconnect layer 54. A material used for the interconnect layer 56 and a thickness of the interconnect pattern of the interconnect layer 56 may be similar to those of the interconnect layer 52, for example.

The solder resist layer 57 is formed on the top surface of insulating layer 55, so as to cover the interconnect layer 56. The solder resist layer 57 may be formed from a photosensitive resin, such as an epoxy-based resin, an acrylic-based resin, or the like, for example. The solder resist layer 57 may have a thickness in a range of approximately 15 µm to approximately 35 µm, for example.

The interconnect layer 58 is formed on one surface of the solder resist layer 57. The interconnect layer 58 includes a via interconnect filling inside a via hole 57*x* that penetrates the solder resist layer 57 to expose a top surface of interconnect layer 56, and pads formed on a top surface of solder resist layer 57. The pad forming the interconnect layer 58 is electrically connected to the interconnect layer 56 through the via interconnect. The via hole 57*x* may be a recess having an inverted truncated cone shape. A diameter of a first opening of the via hole 57*x* which opens at the wiring board 1, may be greater than a diameter of a second opening of the via hole 57*x* which opens at the top surface of the interconnect layer 56. A bottom surface of the second opening of the via hole 57*x* is formed by the top surface of the interconnect layer 56. A material used for the interconnect layer 58 and a thickness of the interconnect pattern of the interconnect layer 58 may be similar to those of the interconnect layer 52, for example. A planar shape of the pad forming the interconnect layer 58 may be a circular shape, for example. A surface treatment layer described above may be formed on the surface (only on the top surface, or on the top surface and the side surface) of the pad forming the interconnect layer 58, as required.

The insulating layer 63 is formed on the other surface of the core layer 50, so as to cover the interconnect layer 62. A material used for the insulating layer 63 and a thickness of the insulating layer 63 may be similar to those of the insulating layer 53, for example. The insulating layer 63 may include a filler, such as silica ($SiO_2$) or the like.

The interconnect layer 64 is formed on the other surface of the insulating layer 63. The interconnect layer 64 includes a via interconnect filling inside a via hole 63*x* that penetrates the insulating layer 63 to expose a bottom surface of interconnect layer 62, and an interconnect pattern formed on a bottom surface of insulating layer 63. The interconnect pattern forming the interconnect layer 64 is electrically connected to the interconnect layer 62 through the via interconnect. The via hole 63x may be a recess having an inverted truncated cone shape. A diameter of a first opening of the via hole 63x which opens at the insulating layer 65, may be greater than a diameter of a second opening of the via hole 63x which opens at the bottom surface of the interconnect layer 62. A bottom surface of the second opening of the via hole 63x is formed by the bottom surface of the interconnect layer 62. A material used for the interconnect layer 64 and a thickness of the interconnect pattern of the interconnect layer 64 may be similar to those of the interconnect layer 52, for example.

The insulating layer 65 is formed on the bottom surface of the insulating layer 63, so as to cover the interconnect layer 64. A material used for the insulating layer 65 and a thickness of the insulating layer 65 may be similar to those of the insulating layer 53, for example. The insulating layer 65 may include a filler, such as silica ($SiO_2$) or the like.

The interconnect layer 66 is formed on the other surface of the insulating layer 65. The interconnect layer 66 includes a via interconnect filling inside a via hole 65x that penetrates the insulating layer 65 to expose a bottom surface of the interconnect layer 64, and an interconnect pattern formed on a bottom surface of insulating layer 65. The interconnect pattern forming the interconnect layer 66 is electrically connected to the interconnect layer 64 through the via interconnect. The via hole 65x may be a recess having an inverted truncated cone shape. A diameter of a first opening of the via hole 65x which opens at the solder resist layer 67, may be greater than a diameter of a second opening of the via hole 65x which opens at the bottom surface of the interconnect layer 64. A bottom surface of the second opening of the via hole 65x is famed by the bottom surface of the interconnect layer 64. A material used for the interconnect layer 66 and a thickness of the interconnect pattern of the interconnect layer 66 may be similar to those of the interconnect layer 52, for example.

The solder resist layer 67 is formed on the bottom surface of insulating layer 65, so as to cover interconnect layer 66. A material used for the solder resist layer 67 and a thickness of the solder resist layer 67 may be similar to those of the solder resist layer 57, for example. The solder resist layer 67 has an opening 67x, and a portion of the bottom surface of interconnect layer 66 is exposed inside the opening 67x. A planar shape of the opening 67x may be a circular shape, for example. The interconnect layer 66, that is exposed inside the opening 67x, can be used as a pad for making electrical connection with a mounting board or package (not illustrated), such as a motherboard or the like. The surface treatment layer described above may be formed on the bottom surface of the interconnect layer 66 that is exposed inside the opening 67x, as required.

The wiring board 1 is mounted on the wiring board 2. More particularly, the surface treatment layer 110 of the wiring board 1, and the interconnect layer 58 forming an external connection terminal of the wiring board 2, are bonded by a solder layer 41 that solidifies after melting. An underfill resin 42 is filled between the bottom surface of the wiring board 1 (the bottom surface of the insulating layer 12) and the top surface of the wiring board 2 (the top surface of the solder resist layer 57), and the underfill resin 42 also covers a portion of the side surface of the wiring board 1, to thereby bond the wiring board 1 and the wiring board 2 to each other.

A stiffener 70 is attached to an outer periphery of the top surface of the wiring board 2 (the top surface of the solder resist layer 57). The stiffener 70 has a planar shape that is a picture-frame shape, for example. The stiffener 70 is provided to reinforce the strength of the entire laminated wiring board 3, and to reduce a warp that occurs when mounting the laminated wiring board 3 on the motherboard or the like. A material used for the stiffener 70 may be SUS 304 (stainless steel including Cr and Ni as main components thereof: 0.08C-18Cr-8Ni) or the like, for example. The material used for the stiffener 70 may also be a metal plate made of copper, copper alloy, or the like, and a resin plate, such as a glass epoxy substrate or the like. The stiffener 70 may be provided, as required.

As described above, by mounting the wiring board 1 that includes the interconnect layers having the high interconnect density on the wiring board 2 that includes the interconnect layers having the low interconnect density, it is possible to easily manufacture the laminated wiring board 3 that can be mounted with the semiconductor chip.

Further, because the wiring board 1 has a small warp, there is little variation in the distance between the interconnect layer 11 of each wiring board 1 and the interconnect layer 58 of the wiring board 2 opposing the interconnect layer 11. For this reason, it is possible to improve a connection reliability of the interconnect layer 11 and the interconnect layer 58 through the solder layer 41.

Second Application Example of First Embodiment

A second application example of the first embodiment illustrates an example of a semiconductor device in which a semiconductor chip is mounted on the laminated wiring board according to the first application example of the first embodiment. In the second application example of the first embodiment, the description of the same component as that of the embodiment described above may be omitted.

Figure 9:
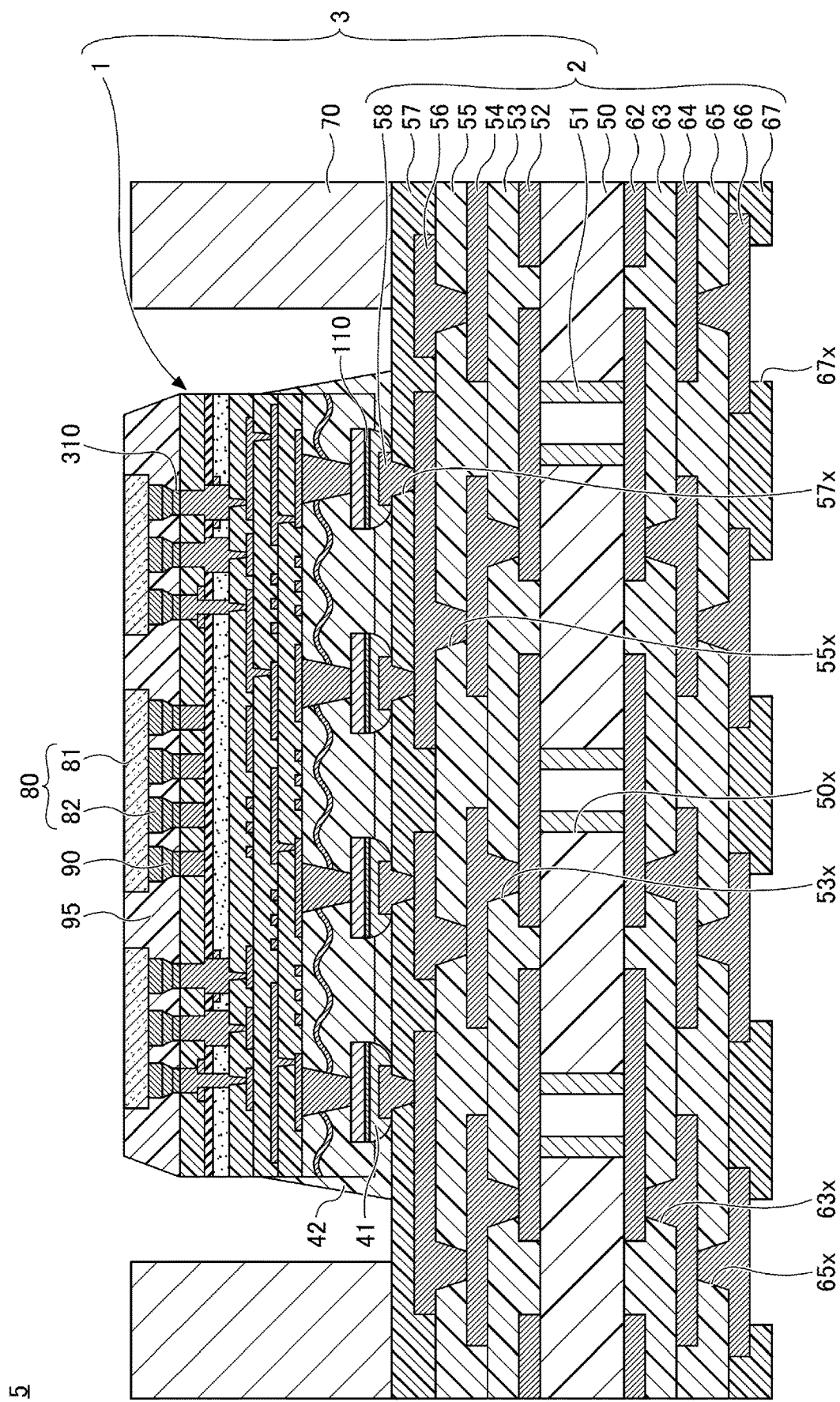
FIG. 9 is a cross sectional view illustrating an example of a semiconductor device according to a second application example of the first embodiment.

FIG. 9 is a cross sectional view illustrating an example of the semiconductor device according to the second application example of the first embodiment. As illustrated in FIG. 9, a semiconductor device 5 includes the laminated wiring board 3 illustrated in FIG. 8, a semiconductor chip 80, a bump 90, and an underfill resin 95. A plurality of semiconductor chips 80 are flip-chip bonded to the laminated wiring board 3.

The semiconductor chip 80 has a semiconductor integrated circuit (not illustrated) or the like formed on a thin semiconductor substrate 81 made of silicon or the like, for example. An electrode pad 82 is formed on a circuit forming surface of the semiconductor substrate 81, and this electrode pad 82 electrically connected to the semiconductor integrated circuit (not illustrated). The circuit forming surface of the semiconductor substrate 81 is an area in which one or more circuits are formed.

The electrode pad 82 of the semiconductor chip 80 is electrically connected to the surface treatment layer 310 of the laminated wiring board 3 through the bump 90. The underfill resin 95 is filled between the circuit forming surface of the semiconductor chip 80 and the top surface of the wiring board 1, and also covers a side surface of the semiconductor chip 80. The bump 90 is a solder bump, for example. Examples of a material used for the solder bump include SnBi solder or the like, for example.

Each of the semiconductor chips 80 may have the same size or have different sizes. In addition, each of the semiconductor chips 80 may have the same function or have different functions. Examples of the function of the semiconductor chip 80 include a memory (Dynamic Random Access Memory (DRAM) or the like), a logic circuit (Central Processing Unit (CPU) or the like), or the like. Moreover, one or two semiconductor chips 80 may be mounted on the laminated wiring board 3, or four or more semiconductor chips 80 may be mounted on the laminated wiring board 3.

As described above, the semiconductor device 5 can be obtained by mounting the semiconductor chips 80 on the laminated wiring board 3 according to the first application example according to the first embodiment. Because the semiconductor chips 80 are mounted on the wiring board 1 that includes the interconnect layers having the high interconnect density, the semiconductor chips 80 can easily be connected to each other by the interconnect patterns having the high interconnect density, to thereby enable exchange of signals among the semiconductor chips 80. Further, in the wiring board 1 forming the semiconductor device 5, because the thin film capacitor 20 is disposed immediately under the pad 33 near the semiconductor chip 80, it is possible to reduce the equivalent series inductance of the thin film capacitor 20, and enable the semiconductor chip 80 to operate at a high frequency.

First Modification of First Embodiment

A first modification of the first embodiment illustrates an example in which the thin film capacitor is provided on the wiring board 2. In the first modification of the first embodiment, a description of constituent elements that are the same as those of the embodiment already described above may be omitted.

Figure 10:
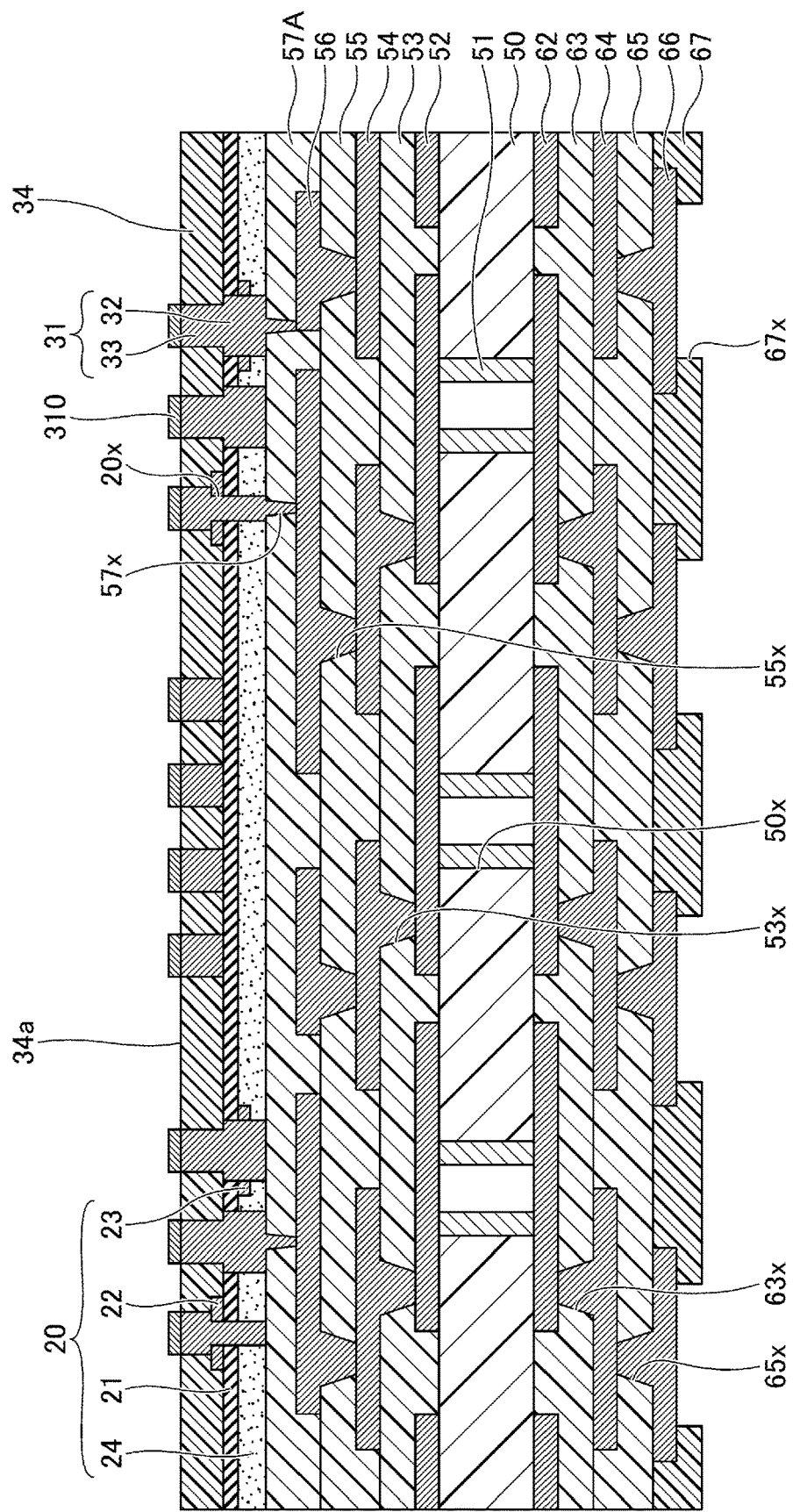
FIG. 10 is a cross sectional view illustrating an example of the wiring board according to a first modification of the first embodiment.

FIG. 10 is a cross sectional view illustrating an example of the wiring board according to the first modification of the first embodiment. In a wiring board 6 illustrated in FIG. 10, the solder resist layer 57 is replaced by an insulating layer 57A, and a thin film capacitor 20, the interconnect layer 31 and the encapsulating resin layer 34 are provided on an insulating layer 57A in place of the interconnect layer 58, in the wiring board 2 illustrated in FIG. 8. The insulating layer 57A is formed of a non-photosensitive thermosetting insulating resin, similar to the insulating layer 53. The interconnect layer 31 is electrically connected to the interconnect layer 56 through the via interconnect 32 inside the via hole 20x and the via hole 57x that communicates with via holes 20x. When forming the via hole 57x in the insulating layer 57A, laser beam machining method may be used, for example.

Accordingly, the thin film capacitor 20 may be provided on the photosensitive insulating resin, such as the wiring board 1, or on the non-photosensitive thermosetting insulating resin, such as the wiring board 6. In the wiring board 6, a semiconductor chip can be mounted on the encapsulating resin layer 34.

In the wiring board 6, the thin film capacitor 20 is disposed immediately under the pad 33, similar to the wiring board 1. Because the pad 33 is used as the external connection terminal for making electrical connection with the semiconductor chip, when the semiconductor chip is mounted on the wiring board 6, the thin film capacitor 20 is disposed at a position near the semiconductor chip. For this reason, it is possible to reduce the equivalent serial inductance of the thin film capacitor 20, and enable the semiconductor chip to operate at a high frequency.

In addition, in the wiring board 6, due to the provision of the encapsulating resin layer 34 that is laminated on the thin film capacitor 20, the structure reduces the thermal stress and pressure generated when mounting the semiconductor chip from easily affecting the thin film capacitor 20, similar to the wiring board 1, to thereby reduce damage to the thin film capacitor 20. Moreover, in the wiring board 6, the wetting and spread of the solder become constant when mounting the semiconductor chip, similar to the wiring board 1, to thereby improve the mounting reliability of the semiconductor chip.

According to each of the embodiments and application examples described above, it is possible to provide a wiring board capable of reducing damage to a thin film capacitor.

Various aspects of the subject matter described herein may be set out non-exhaustively in the following numbered clauses:

1. A method for manufacturing a wiring board, comprising:
   laminating a thin film capacitor on an insulating layer;
   forming an interconnect layer electrically connected to the thin film capacitor; and
   laminating an encapsulating resin layer on the thin film capacitor, wherein
   the interconnect layer includes a pad protruding from the thin film capacitor,
   the encapsulating resin layer is a mold resin including a non-photosensitive thermosetting resin as a main component thereof, and
   the laminating the encapsulating resin layer includes
     forming the encapsulating resin layer so as to cover a top surface and a side surface of the pad, and
     polishing a top surface of the encapsulating resin layer to expose the top surface of the pad.

2. The method for manufacturing the wiring board according to clause 1, wherein the interconnect layer includes a via interconnect, that is formed continuously with the pad, and penetrates the thin film capacitor and the insulating layer.

3. The method for manufacturing the wiring board according to clause 2, wherein
   the thin film capacitor has a dielectric, and an electrode provided on the dielectric, and
   the interconnect layer includes a via interconnect penetrating the dielectric and the electrode.

4. The method for manufacturing the wiring board according to clause 3, wherein
   the interconnect layer includes a plurality of pads protruding from the thin film capacitor,
   the electrode includes a first electrode provided on a first surface of the dielectric, and a second electrode provided on a second surface of the dielectric opposite to the first surface of the dielectric,
   at least one of the plurality of the pads has a first via interconnect penetrating the first electrode, and
   at least one of the plurality of pads has a second via interconnect penetrating the second electrode.

5. The method for manufacturing the wiring board according to clause 4, wherein the plurality of pads has a uniform height.

Although the application examples are numbered with, for example, "first," or "second," the ordinal numbers do not imply priorities of the application example. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
    an insulating layer;
    a thin film capacitor laminated on the insulating layer;
    an interconnect layer electrically connected to the thin film capacitor; and
    an encapsulating resin layer laminated on the thin film capacitor, wherein
    the thin film capacitor includes a dielectric provided between the insulating layer and the encapsulating resin layer, a first electrode provided on a first surface of the dielectric, and a second electrode provided on a second surface of the dielectric opposite to the first surface,
    the interconnect layer includes a first via interconnect electrically connected to the first electrode, a first pad formed continuously with the first via interconnect and protruding from the thin film capacitor, a second via interconnect electrically connected to the second electrode, and a second pad formed continuously with the second via interconnect and protruding from the thin film capacitor,
    the first via interconnect penetrates the encapsulating resin layer, the first electrode, and the dielectric,
    the second via interconnect penetrates the encapsulating resin layer, the dielectric, and the second electrode,
    the encapsulating resin layer is a mold resin having a non-photosensitive thermosetting resin as a main component thereof, and
    the encapsulating resin layer exposes a top surface of each of the first and second pads, and covers at least a portion of a side surface of each of the first and second pads.

2. The wiring board as claimed in claim 1, wherein each of the first and second pads has a uniform height.

3. The wiring board as claimed in claim 1, wherein each of the first and second pads has a uniform top surface area.

4. The wiring board as claimed in claim 1, wherein a top surface of each of the first and second pads protrudes from the encapsulating resin layer.

5. The wiring board as claimed in claim 1, wherein each of the first and second pads is an external connection terminal for making electrical connection with a semiconductor chip.

6. The wiring board as claimed in claim 1, wherein the insulating layer includes a photosensitive resin as a main component thereof.

7. The wiring board as claimed in claim 1, further comprising:
    a surface treatment layer formed on the top surface of each of the first and second pads.

8. The wiring board as claimed in claim 1, wherein
    each of the first and second via interconnects penetrates the thin film capacitor with a first diameter, and penetrates the insulating layer with a second diameter, and
    the first diameter is greater than the second diameter.

9. The wiring board as claimed in claim 1, wherein
    the thin film capacitor further has an adhesive layer,
    the dielectric is connected to the insulating layer through the adhesive layer, and
    each of the first and second via interconnects penetrates the adhesive layer.

10. The wiring board as claimed in claim 1, wherein the first electrode and the second electrode do not overlap in a plan view.

11. The wiring board as claimed in claim 1, wherein the encapsulating resin layer has a thermal expansion coefficient lower than a thermal expansion coefficient of the insulating layer.

12. The wiring board as claimed in claim 1, wherein
    the first electrode is electrically connected to a ground, and
    the second electrode is electrically connected to a power supply.

* * * * *